(12) United States Patent
Kido

(10) Patent No.: US 10,236,859 B2
(45) Date of Patent: Mar. 19, 2019

(54) FILTER COMPONENT WITH PASSIVE ELEMENT AND RADIO-FREQUENCY MODULE

(71) Applicant: Murata Manufacturing Co., Ltd., Nagaokakyo-shi, Kyoto-fu (JP)

(72) Inventor: Syunsuke Kido, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/480,522

(22) Filed: Apr. 6, 2017

(65) Prior Publication Data

US 2017/0214386 A1 Jul. 27, 2017

Related U.S. Application Data

(63) Continuation of application No. PCT/JP2015/080159, filed on Oct. 27, 2015.

(30) Foreign Application Priority Data

Oct. 30, 2014 (JP) .................. 2014-221023

(51) Int. Cl.
| | |
|---|---|
| *H03H 9/25* | (2006.01) |
| *H03H 9/64* | (2006.01) |
| *H03H 9/145* | (2006.01) |
| *H03H 9/02* | (2006.01) |
| *H03H 9/05* | (2006.01) |

(Continued)

(52) U.S. Cl.
CPC ........ *H03H 9/145* (2013.01); *H03H 9/02007* (2013.01); *H03H 9/02535* (2013.01); *H03H 9/0557* (2013.01); *H03H 9/1014* (2013.01); *H03H 9/1071* (2013.01); *H03H 9/175* (2013.01); *H03H 9/25* (2013.01)

(58) Field of Classification Search
CPC .................................. H03H 9/25; H03H 9/64
USPC .......................................... 333/133, 193–196
See application file for complete search history.

(56) References Cited

U.S. PATENT DOCUMENTS

| | | | | |
|---|---|---|---|---|
| 5,561,406 A | * | 10/1996 | Ikata ................. | H03H 9/0576 333/126 |
| 7,176,903 B2 | * | 2/2007 | Katsuki ............... | G06F 3/0436 345/173 |

(Continued)

FOREIGN PATENT DOCUMENTS

| | | |
|---|---|---|
| JP | 03-220911 A | 9/1991 |
| JP | 05-114828 A | 5/1993 |

(Continued)

OTHER PUBLICATIONS

Official Communication issued in International Patent Application No. PCT/JP2015/080159, dated Dec. 28, 2015.

(Continued)

*Primary Examiner* — Dean O Takaoka
(74) *Attorney, Agent, or Firm* — Keating & Bennett, LLP

(57) ABSTRACT

A filter component with a passive element includes a filter substrate, an elastic wave filter including an elastic wave resonator in a predetermined region of one main surface of the filter substrate, and a support substrate on another main surface of the filter substrate, wherein a passive element is provided in or on a support substrate, the passive element includes a wiring electrode and is electrically connected to the elastic wave filter.

17 Claims, 8 Drawing Sheets

(51) Int. Cl.
*H03H 9/10* (2006.01)
*H03H 9/17* (2006.01)

(56) References Cited

U.S. PATENT DOCUMENTS

| | | | |
|---|---|---|---|
| 7,180,387 B2* | 2/2007 | Hongo | H03H 9/0576 333/129 |
| 7,227,429 B2* | 6/2007 | Kawachi | H03H 9/0547 29/25.35 |
| 7,276,992 B2* | 10/2007 | Iwamoto | H03H 9/0576 333/133 |
| 2004/0226162 A1 | 11/2004 | Miura et al. | |
| 2005/0104685 A1 | 5/2005 | Kuroki et al. | |
| 2005/0116352 A1 | 6/2005 | Warashina et al. | |
| 2012/0194032 A1 | 8/2012 | Kadota | |
| 2013/0027156 A1 | 1/2013 | Yamato | |
| 2013/0187246 A1 | 7/2013 | Adkisson et al. | |
| 2015/0180447 A1* | 6/2015 | Okuda | H03H 9/0085 333/133 |

FOREIGN PATENT DOCUMENTS

| | | |
|---|---|---|
| JP | 09-98056 A | 4/1997 |
| JP | 10-276059 A | 10/1998 |
| JP | 2002-164765 A | 6/2002 |
| JP | 2004-343359 A | 12/2004 |
| JP | 2004-343359 A1 * | 12/2004 |
| JP | 2005-102098 A | 4/2005 |
| JP | 2005-167969 A | 6/2005 |
| JP | 2006-060563 A | 3/2006 |
| JP | 2010-171680 A | 8/2010 |
| JP | 2010-278971 A | 12/2010 |
| JP | 2013-031030 A | 2/2013 |
| WO | 2011/046117 A1 | 4/2011 |
| WO | 2014-045726 A1 | 3/2014 |

OTHER PUBLICATIONS

Official Communication issued in Japanese Patent Application No. 2016-556566, dated Nov. 6, 2018.

* cited by examiner

FILTER COMPONENT WITH PASSIVE ELEMENT AND RADIO-FREQUENCY MODULE

CROSS REFERENCE TO RELATED APPLICATIONS

This application claims the benefit of priority to Japanese Patent Application No. 2014-221023 filed on Oct. 30, 2014 and is a Continuation Application of PCT Application No. PCT/JP2015/080159 filed on Oct. 27, 2015. The entire contents of each application are hereby incorporated herein by reference.

BACKGROUND OF THE INVENTION

1. Field of the Invention

The present invention relates to a filter component with a passive element, which includes an elastic wave filter including an elastic wave resonator, and also to a radio-frequency module including the filter component.

2. Description of the Related Art

Hitherto, a radio-frequency module 500 shown in FIG. 15 is known (see, for example, Japanese Unexamined Patent Application Publication No. 2013-31030 (paragraphs 0012 to 0037, FIGS. 1 to 7, Abstract, etc.)). The radio-frequency module 500 is a module mounted on a mother substrate included in a communication mobile terminal such as a cellular phone and a mobile information terminal. The radio-frequency module 500 includes a module substrate 501. In accordance with the required functions of the radio-frequency module 500, circuit elements, for example, various electronic components such as a filter component 502 (duplexer) and a switch IC, various electric circuits such as a matching circuit and other filter circuits, various passive elements such as inductors, capacitors, and resistors, are selected and are mounted on the module substrate 501. The filter component 502, a chip passive element component for forming a matching circuit, and various other electronic components are mounted on mounting electrodes 501a provided on the mounting surface of the module substrate 501.

The filter component 502 has a wafer level-chip size package (WL-CSP) structure, and includes a filter substrate 503, an insulating layer 504, a cover layer 505, and an elastic wave filter 506 having comb-shaped electrodes (IDT electrodes).

The filter substrate 503 is a piezoelectric substrate made of a piezoelectric substance such as lithium niobate, lithium tantalate, or quartz. Plural elastic wave resonators 506a constituted by comb-shaped electrodes and reflectors made of Al or Cu are provided in a predetermined region 503b of one main surface 503a of the filter substrate 503. The plural elastic wave resonators 506a are combined to form the elastic wave filter 506 (surface acoustic wave or SAW filter). The elastic wave filter 506 includes a transmit filter that transmits signals and a receive filter that receives signals.

The insulating layer 504 surrounds the predetermined region 503b of the main surface 503a of the filter substrate 503, and the cover layer 505 is disposed on the insulating layer 504 so as to form, together with the insulating layer 504, a surrounded space between the filter substrate 503 and the cover layer 505. The elastic wave filter 506 is disposed in this space.

Plural external-connecting terminal electrodes 507 pass through the insulating layer 504 and the cover layer 505 and are exposed on a main surface of the cover layer 505. The terminal electrodes 507 are electrically connected to the elastic wave filter 506. The filter component 502 is disposed such that the cover layer 505 opposes the mounting surface of the module substrate 501. The filter component 502 is electrically connected to mounting electrodes 501a on the mounting surface of the module substrate 501 via solder bumps H formed on the respective terminal electrodes 507.

The module substrate 501 is a multilayer substrate constituted by plural insulator layers stacked on each other. As a result of forming via-conductors and in-planar conductive patterns in the insulator layers as required, a wiring electrode 508 is formed in the module substrate 501. At least a portion of the wiring electrode 508 forms various passive elements P, such as an inductor for adjusting the characteristics of the elastic wave filter 506 and a capacitor and an inductor for forming a matching circuit, which are electrically connected to the filter component 502 (elastic wave filter 506).

For the actual use of the elastic wave filter 506 including the elastic wave resonators 506a, a passive element P, such as an inductor, is connected to the elastic wave filter 506 to adjust the filter characteristics. For example, if the filter component 502 having a WL-CSP structure is bare-chip-mounted on the module substrate 501, the passive element P constituted by the wiring electrode 508 within the module substrate 501 is connected to the elastic wave filter 506 included in the filter component 502, as shown in FIG. 15. Forming of the passive element P in the module substrate 501 makes the module substrate 501 thicker, and the height of the radio-frequency module 500 including the module substrate 501 on which the filter component 502 is mounted is accordingly increased.

It is known from simulation analysis results that the thickness of the single-layer filter substrate 503 necessary for forming the elastic wave resonator 506a on the main surface 503a is about five or six times as large as the pitch of comb-shaped electrodes. The pitch of the comb-shaped electrodes is set in accordance with the resonant and anti-resonant frequencies of the elastic wave resonators 506a. The pitch corresponds to half the wavelength, and the typical pitch of a 2 GHz-SAW filter, for example, is about 1 μm. In the related art, however, to improve the handling characteristics of the filter component 502 when being bare-chip-mounted on the module substrate 501 and to prevent cracking or chipping of the filter substrate 503, the filter substrate 503 is formed very thick, for example, at a thickness of 100 μm or greater. In a 2 GHz-SAW filter, for example, the filter substrate 503 is formed at a thickness of about 100 times as large as the pitch of the filter. The filter substrate 503 is formed excessively thick. This increases the height of the radio-frequency module 500 including the filter component 502 mounted on the module substrate 501.

SUMMARY OF THE INVENTION

Preferred embodiments of the present invention provide a filter component with a passive element in which a filter substrate has a reduced thickness and a reduced total height of the filter component mounted on a module substrate, and also provide a radio-frequency module including the filter component.

A filter component with a passive element according to a preferred embodiment of the present invention includes a filter substrate and a support substrate. An elastic wave filter including an elastic wave resonator is disposed in a predetermined region of one main surface of the filter substrate. The support substrate is disposed on the other main surface of the filter substrate. A passive element is provided in or on the support substrate. The passive element includes a wiring electrode and is electrically connected to the elastic wave filter.

In the preferred embodiment of the present invention as described above, the filter substrate, which is reinforced by the support substrate, is thinner than the related art. Additionally, the provision of a passive element in or on the support substrate makes it possible to reduce the number of wiring electrodes located in or on a module substrate on which the filter component is mounted. Thus, the module substrate is smaller and thinner than the related art. Because of the provision of a passive element for the elastic wave filter in or on the support substrate which reinforces the filter substrate, it is possible to provide a filter component with a passive element in which the total height of the filter component mounted on a module substrate is smaller than the related art.

The thickness of the filter substrate may be smaller than that of the support substrate.

This configuration makes it possible to reliably decrease the total thickness of the filter component mounted on a module substrate to be smaller than the related art.

The thickness of the filter substrate may be smaller than about 100 μm, for example.

This configuration makes it possible to decrease the total thickness of the filter component mounted on a module substrate to be smaller than the related art.

The filter substrate may be a piezoelectric substrate. The elastic wave filter may be a SAW filter which includes the elastic wave resonator including comb-shaped electrodes disposed on one main surface of the piezoelectric substrate.

This configuration makes it possible to provide a filter component with a passive element including a SAW filter with a practical configuration.

When the pitch of the comb-shaped electrodes is p μm, the thickness t of the piezoelectric substrate may be expressed by:

$$5 \cdot p \ \mu m \leq t \leq 100 \ \mu m, \text{ for example.}$$

It is known from simulation analysis results that the thickness of a single-layer piezoelectric substrate preferably for a SAW filter is about five or six times as large as the pitch p μm of comb-shaped electrodes. A single-layer piezoelectric substrate with a thickness of about 100 μm or smaller is difficult to handle and may crack or chip while being manufactured. In the structure of the preferred embodiments of the present invention in which the support substrate is disposed on the other main surface of the filter substrate (piezoelectric substrate), the filter substrate even with a thickness of about 100 μm or smaller may be easily handled. By providing the support substrate on the other main surface of the piezoelectric substrate, the filter substrate may include a thickness t expressed by $5 \cdot p \ \mu m \leq t \leq 100 \ \mu m$, for example. It is thus possible to make the piezoelectric substrate thinner than the related art without impairing the functions of the SAW filter.

The filter substrate may be defined as a double layer substrate including a high acoustic velocity layer and a piezoelectric layer. The piezoelectric layer may be disposed on one main surface of the high acoustic velocity layer, and the support substrate may be disposed on the other main surface of the high acoustic velocity layer. The elastic wave filter may be a SAW filter which includes the elastic wave resonator including comb-shaped electrodes provided on one main surface of the piezoelectric layer. The acoustic velocity of bulk waves propagating in the high acoustic velocity layer may be faster than the acoustic velocity of elastic waves propagating on the piezoelectric layer.

With this configuration, by defining the filter substrate as a double layer substrate including a high acoustic velocity layer and a piezoelectric layer, the thickness of the filter substrate may be further decreased.

When the pitch of the comb-shaped electrodes is p μm, the thickness t of the piezoelectric substrate may be expressed by:

$$0.05 \cdot p \ \mu m \leq t \leq 100 \ \mu m, \text{ for example.}$$

This configuration makes it possible to make the filter substrate even thinner without impairing the functions of the SAW filter. Because of the provision of the support substrate on the other main surface of the filter substrate, the filter substrate even with a thickness of about 100 μm or smaller may be easily handled.

The support substrate may be a multilayer substrate.

With this configuration, various passive elements may include wiring electrodes within the multilayer substrate, thus enhancing the functionality of the filter component.

The passive element may be integrated within the multilayer substrate.

This configuration makes it possible to further decrease the thickness of the filter component.

The filter component may further include an insulating layer, a cover layer, and an external-connecting terminal electrode. The insulating layer surrounds the predetermined region of one main surface of the filter substrate. The cover layer is disposed on the insulating layer so as to define, together with the insulating layer, a surrounded space between the filter substrate and the cover layer. The external-connecting terminal electrode is exposed on a main surface of the cover layer on a side opposite to the other main surface facing the space and is electrically connected to the elastic wave filter.

The filter component may further include an insulating layer, a cover layer, and an external-connecting terminal electrode. The insulating layer surrounds the predetermined region of one main surface of the filter substrate. The cover layer is disposed on the insulating layer so as to define, together with the insulating layer, a surrounded space between the filter substrate and the cover layer. The external-connecting terminal electrode is provided on a main surface of the support substrate on a side opposite to the other main surface facing the filter substrate and is electrically connected to the elastic wave filter.

This configuration makes it possible to provide a filter component with a passive element including an external-connecting terminal electrode with a practical configuration.

Adjacent to the filter substrate, another filter substrate may be provided on the support substrate.

With this configuration, by providing another filter substrate on the support substrate, a filter component with a passive element with increased functionalities is provided.

A radio-frequency module according to a preferred embodiment of the present invention includes the filter component and a module substrate on which the filter component is mounted.

With this configuration, at least some of passive elements disposed in or on a module substrate in the related art are disposed in or on a filter component with a passive element. This allows the module substrate to be smaller and thinner than the related art, thus reducing the size and the height of the radio-frequency module.

Another passive element connected to the elastic wave filter may be provided in or on the module substrate.

This configuration increases the flexibility in disposing passive elements, thus enhancing the flexibility in designing the radio-frequency module.

According to various preferred embodiments of the present invention, a passive element to adjust the characteristics of an elastic wave filter is provided in or on a support substrate which reinforces a filter substrate. Thus, the filter substrate may be made thinner. Additionally, at least some passive elements are not required to be located in or on a module substrate. Thus, the module substrate may be made thinner. Accordingly, it is possible to provide a filter component with a passive element in which the total height of the filter component mounted on the module substrate is smaller than the related art.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
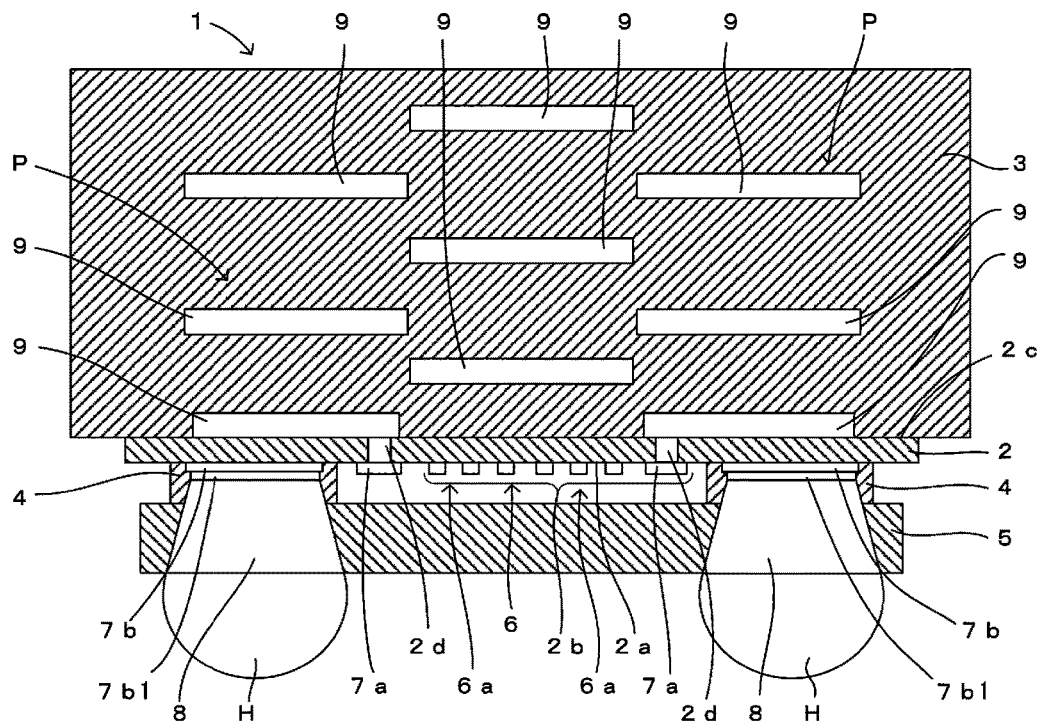
FIG. 1 is a sectional view illustrating a filter component with a passive element according to a first preferred embodiment of the present invention.

A first preferred embodiment of a radio-frequency module of the present invention will be described below with reference to FIG. 1. FIG. 1 illustrates the configuration of only major components according to a preferred embodiment of the present invention, and the configuration of the other components is not shown for the sake of simple representation. As well as FIG. 1, the other drawings, which will be discussed later, also illustrate the configuration of only major components. This explanation will be omitted in the following description.

As shown in FIG. 1, a filter component 1 with a passive element includes a filter substrate 2 provided with a rectangular or substantially rectangular shape as viewed from above, a support substrate 3, an insulating layer 4, a cover layer 5, and an elastic wave filter 6.

In this preferred embodiment, the filter substrate 2 is a piezoelectric substrate made of a piezoelectric substance such as lithium niobate, lithium tantalate, or quartz. Plural elastic wave resonators 6a including comb-shaped electrodes (IDT electrodes) and reflectors made of Al or Cu are provided in a predetermined region 2b of one main surface 2a of the filter substrate 2. The plural elastic wave resonators 6a are combined to define the elastic wave filter 6 (SAW (surface acoustic wave) filter). The elastic wave filter 6 includes a transmit filter that transmits signals and a receive filter that receives signals.

In this preferred embodiment, when the pitch of the comb-shaped electrodes of the elastic wave resonators 6a, which is set in accordance with the resonant and anti-resonant frequencies of the elastic wave resonators 6a, is p μm, the filter substrate 2 is made with a thickness t expressed by:

$$5 \cdot p \ \mu m \leq t \leq 100 \ \mu m, \text{ for example.}$$

More specifically, for example, when the pitch p of the comb-shaped electrodes is set to be about 2 μm, the filter substrate 2 preferably includes a 40°-Y-cut single-layer LiTaO$_3$ including a thickness t of about 10 μm, for example.

On the main surface 2a of the filter substrate 2, wiring electrodes 7a and terminal electrodes 7b, which are electrically connected to the elastic wave resonators 6a defining the elastic wave filter 6, are provided. Via-conductors 2d are located in the filter substrate 2. The via-conductors 2d are used to electrically connect the wiring electrodes 7a to the support substrate 3 disposed on the other main surface 2c of the filter substrate 2. An external-connecting terminal electrode 8 is electrically connected to each of the terminal electrodes 7b via a plating layer 7b1. Each terminal electrode 8 passes through the insulating layer 4 and the cover layer 5 such that it is exposed on a main surface of the cover layer 5 on the side opposite to the other main surface facing a space defined between the filter substrate 2 and the cover layer 5.

The insulating layer 4 is located to surround the predetermined region 2b where the elastic wave resonators 6a (comb-shaped electrodes and reflectors) and the wiring electrodes 7a provided on the main surface 2a of the filter substrate 2 are disposed. More specifically, the insulating layer 4 is preferably formed in the following non-limiting exemplary manner. A resin layer made of a photosensitive epoxy resin or polyimide resin is formed with a thickness of about 14 μm on the main surface 2a of the filter substrate 2 on which the elastic wave resonators 6a, the wiring electrodes 7a, and the terminal electrodes 7b are disposed. Then, by using a photolithographic process, the resin layer corresponding to the predetermined region 2b where the elastic wave resonators 6a and the wiring electrodes 7a are disposed and a region where the terminal electrodes 7b are disposed is removed.

The cover layer 5 is disposed on the insulating layer 4 so as to define, together with the insulating layer 4, a surrounded space between the filter substrate 2 and the cover layer 5. Within this space, the elastic wave filter 6 is disposed. More specifically, the cover layer 5 is preferably formed in the non-limiting exemplary following manner. A resin layer made of a photosensitive epoxy resin or polyimide resin with a thickness of about 45 μm is stacked on the insulating layer 4 by using a photolithographic process. Then, a Cu or Al paste is filled into connecting holes of this resin layer or via-filling plating is performed on these connecting holes so as to form the terminal electrodes 8 to be electrically connected to the terminal electrodes 7b. Then, a solder bump H used for mounting is formed at a height of about 80 μm on each terminal electrode 8 which is connected to the terminal electrode 7b and which is exposed on the main surface of the cover layer 5 on the side opposite to the other main surface facing a space within which the elastic wave filter 6 is disposed.

The support substrate 3 is formed at a thickness of about 400 μm to about 500 μm, for example, and is disposed on the other main surface 2c of the filter substrate 2 as a result of being attached to the other main surface 2c by bonding or adhering. In this preferred embodiment, the support substrate 3 is formed as an integral ceramic multilayer body (multilayer substrate) as a result of firing plural dielectric layers, which are made of ceramic green sheets, stacked on each other. More specifically, the dielectric layers are formed in the following manner. Slurry in which mixed powder of, for example, alumina and glass, is mixed with an organic binder and a solvent is formed into sheets in a molding die so as to form ceramic green sheets, which form the dielectric layers. The ceramic green sheets are formed so that they may be fired at a low temperature of about 1000° C. The ceramic green sheets are then cut into a predetermined shape. Then, via-holes are formed in the ceramic green sheets by laser processing, for example. An Ag or Cu conductive paste is then charged into the formed via-holes or via-filling plating is performed on the via-holes so as to form interlayer-connecting via-conductors. Then, various in-planar conductive patterns are formed by printing with a conductive paste. As a result, the dielectric layers are formed.

As a result of forming via-conductors and in-planar conductive patterns in the dielectric layers as required, wiring electrodes 9 including ground electrodes are provided in the support substrate 3. At least some of the wiring electrodes 9 define passive elements P, such as a capacitor and an inductor to adjust the characteristics of the elastic wave filter 6, within the multilayer substrate. Then, the passive elements P are electrically connected to the elastic wave filter 6 via the wiring electrodes 9, the via-conductors 2d disposed in the filter substrate 2, and the wiring electrodes 7a disposed on the filter substrate 2, thus suitably adjusting the characteristics of the elastic wave filter 6.

Passive elements, such as another inductor and another capacitor, may be defined by the in-planar conductive patterns and via-conductors disposed in the dielectric layers of the support substrate 3. Various circuits, such as another filter circuit and another matching circuit, may be defined by a combination of these passive elements. The support substrate 3 may include a multilayer substrate such as a printed substrate, a LTCC substrate, an alumina substrate, or a composite material substrate including materials such as resin, ceramic, and polymer materials. The support substrate 3 may be provided by selecting a suitable material according to the purpose of the use of the filter component 1. Another component may also be mounted on the support substrate 3.

Modified examples will be discussed below with reference to FIGS. 2 and 3. In the following description, the configuration different from that of the filter component 1 will mainly be discussed, and elements similar to those of the filter component 1 are designated by like reference numerals and an explanation thereof will be omitted.

Figure 2:
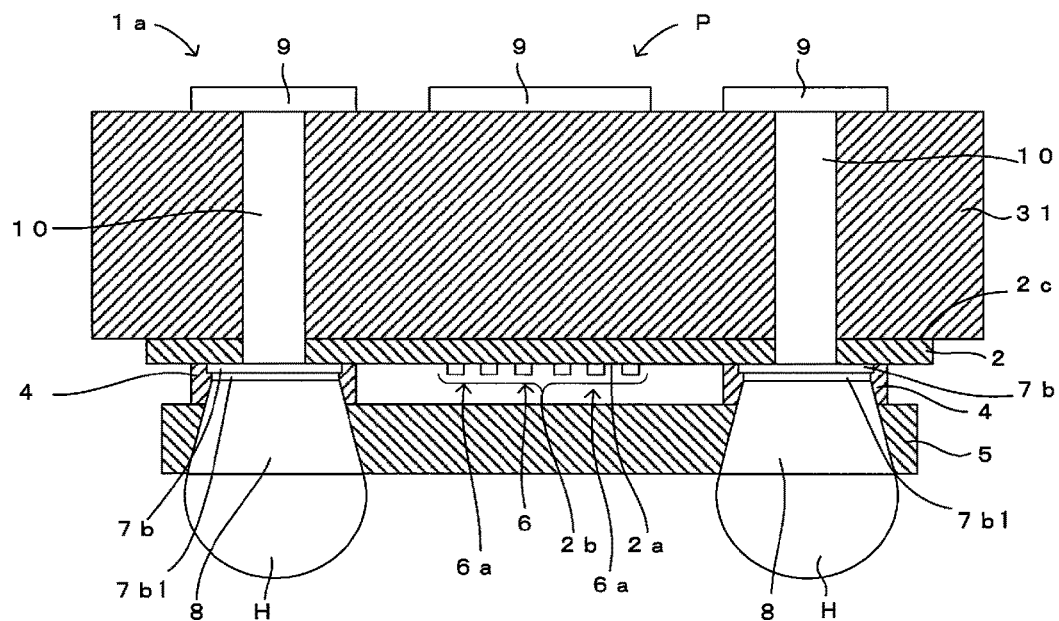
FIG. 2 is a view illustrating a modified example of the filter component shown in FIG. 1.

A filter component 1a with a passive element shown in FIG. 2 is different from the filter component 1 shown in FIG. 1 in that a support substrate 31 is defined as a single layer substrate. The support substrate 31 is provided as a single-layer glass substrate or Si substrate, and wiring electrodes 9 (passive elements P) are disposed on a main surface of the support substrate 31 on the side opposite to the other main surface facing the filter substrate 2. Interlayer-connecting conductors 10 are disposed such that they pass through the filter substrate 2 and the support substrate 31 so as to connect the terminal electrodes 7b on the filter substrate 2 with the wiring electrodes 9 on the support substrate 31.

Figure 3:
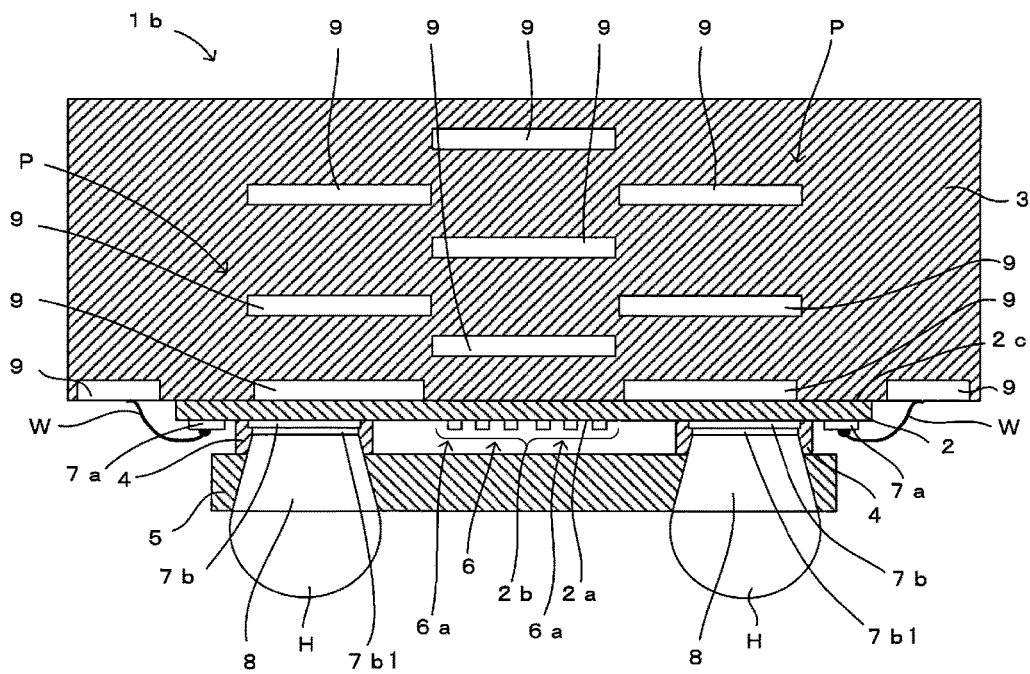
FIG. 3 is a view illustrating another modified example of the filter component shown in FIG. 1.

A filter component 1b with a passive element shown in FIG. 3 is different from the filter component 1 shown in FIG. 1 in that the wiring electrodes 7a on the filter substrate 2 and the wiring electrodes 9 in the support substrate 3 are electrically connected to each other via bonding wire W.

As described above, in this preferred embodiment, the filter substrate 2 is reinforced by the support substrate 3 or 31 attached to the other main surface 2c of the filter substrate 2, and thus, the filter substrate 2 may be made thinner than the related art. Additionally, the passive elements P are provided in the support substrate 3 or on the support substrate 31. It is thus possible to reduce the number of wiring electrodes located in or on a module substrate on which the filter component 1, 1a, or 1b is mounted. Thus, the module substrate may be made smaller and thinner than the related art. Because of the provision of a passive element P to adjust the characteristics of the elastic wave filter 6 in the support substrate 3 or on the support substrate 31 which reinforces the filter substrate 2, it is possible to provide the filter components 1, 1a, and 1b in which the total height of each of the filter components 1, 1a, and 1b mounted on a module substrate is smaller than the related art.

The filter substrate 2 is made less thick than the support substrate 3 or 31. This makes it possible to reliably decrease the total thickness of each of the filter components 1, 1a, and 1b mounted on a module substrate to be smaller than the related art.

The filter substrate 2 includes a piezoelectric substrate, and the elastic wave filter 6 includes a SAW filter including the elastic wave resonators 6a including comb-shaped electrodes disposed on one main surface of the piezoelectric substrate. Thus, the filter components 1, 1a, and 1b with a practical configuration is provided.

It is known from simulation analysis results that the thickness of a single-layer piezoelectric substrate preferably for a SAW filter is about five or six times as large as the pitch p μm of comb-shaped electrodes. By providing the support substrate 3 or 31 on the filter substrate 2 including a piezoelectric substrate, the filter substrate 2 may be made with a thickness t expressed by $5 \cdot p \ \mu m \leq t \leq 100 \ \mu m$, for example. It is thus possible to make the filter substrate 2 thinner than the related art without impairing the functions of the elastic wave filter 6 including a SAW filter.

The support substrate 3 is provided as a multilayer substrate, and various passive elements P may be defined by the wiring electrodes 9 within the support substrate 3. It is thus possible to enhance the functionality of the filter components 1 and 1b.

The passive elements P are integrated within the support substrate 3. It is thus possible to decrease the height of the filter components 1 and 1b, as a whole.

Figure 15:
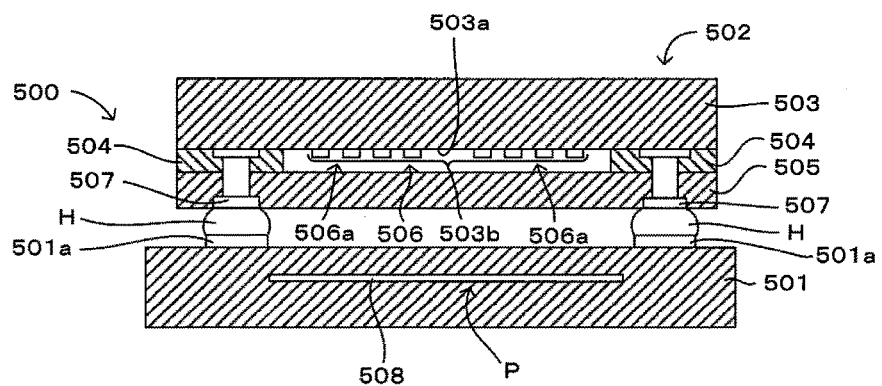
FIG. 15 is a view illustrating a filter component of the related art.

For example, in comparison with the radio-frequency module 500 of the related art shown in FIG. 15 in which the filter component 502 is mounted on the module substrate 501, the thickness of a module product including the filter component 1, 1a, or 1b in the preferred embodiments of the present invention of this application may be reduced by about 0.1 mm, as a whole.

It is possible to provide the filter components 1, 1a, and 1b including the practical external-connecting terminal electrodes 8 exposed on the main surface of the cover layer 5, as in the filter component 502 of the related art with a WL-CSP structure shown in FIG. 15.

Second Preferred Embodiment

A second preferred embodiment of the present invention will be described below with reference to FIG. 4. In the following description, the configuration different from that of the above-described first preferred embodiment will mainly be discussed, and elements similar to those of the first preferred embodiment are designated by like reference numerals and an explanation thereof will be omitted.

Figure 4:
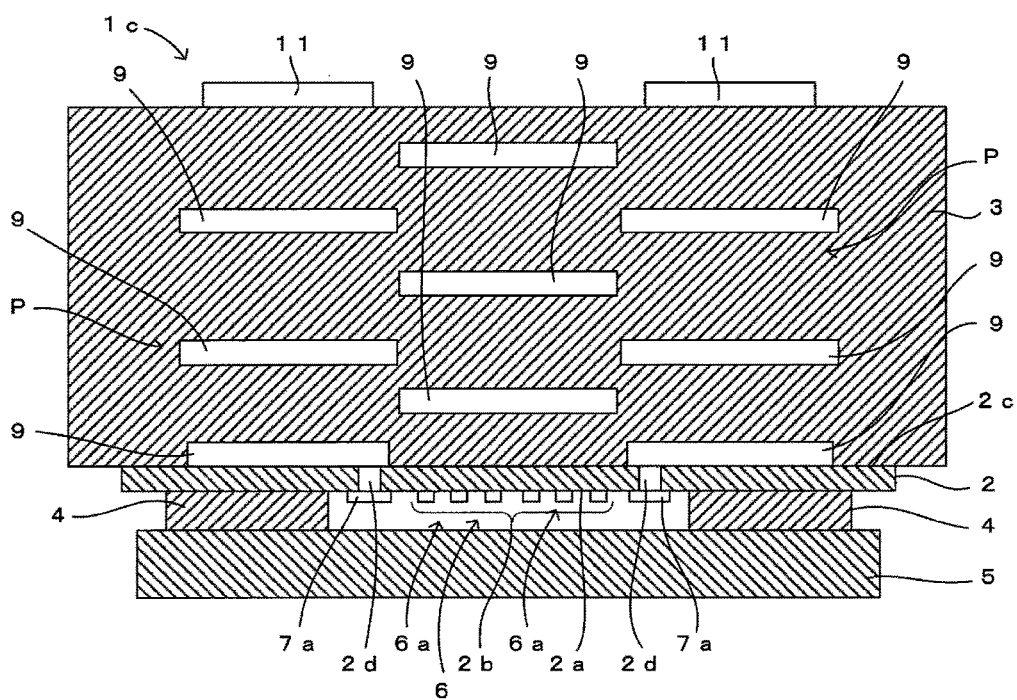
FIG. 4 is a sectional view illustrating a filter component with a passive element according to a second preferred embodiment of the present invention.

A filter component 1c with a passive element shown in FIG. 4 is different from the filter component 1 shown in FIG. 1 in that external-connecting land-shaped terminal electrodes 11 are disposed on the main surface of the support substrate 3 on the side opposite to the other main surface facing the filter substrate 2. The terminal electrodes 11 are electrically connected to the elastic wave filter 6 via the wiring electrodes 9, the via-conductors 2d disposed in the filter substrate 2, and the wiring electrodes 7a disposed on the filter substrate 2.

A modified example will be discussed below with reference to FIG. 5.

Figure 5:
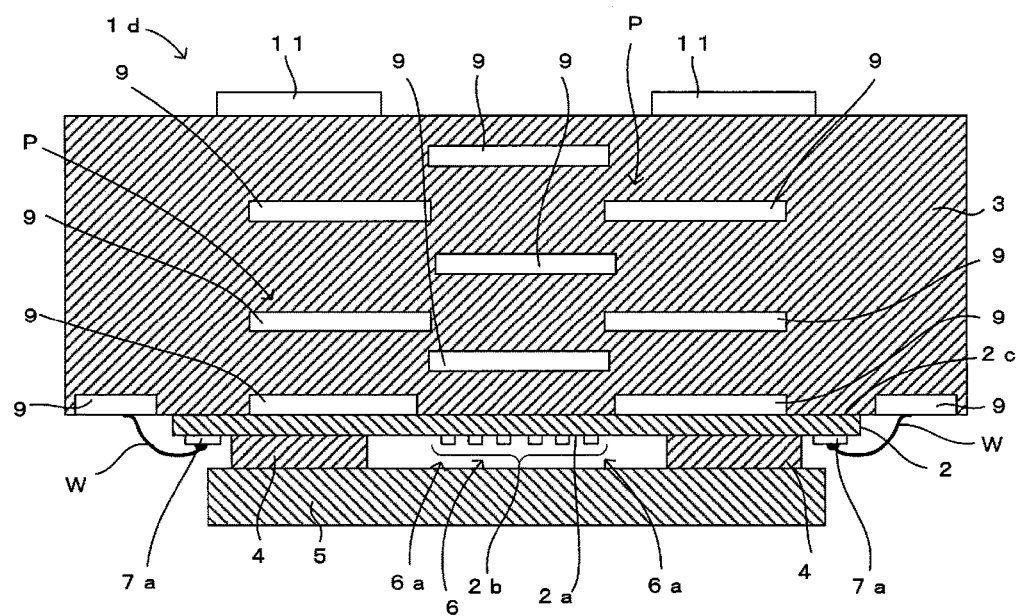
FIG. 5 is a view illustrating a modified example of the filter component shown in FIG. 4.

A filter component 1d with a passive element shown in FIG. 5 is different from the filter component 1c shown in FIG. 4 in that the wiring electrodes 7a on the filter substrate 2 and the wiring electrodes 9 in the support substrate 3 are electrically connected to each other via bonding wire W.

As described above, in this preferred embodiment, it is possible to provide the filter components 1c and 1d in which the external-connecting land-shaped terminal electrodes 11 with a practical configuration are disposed on the main surface of the support substrate 3 on the side opposite to the other main surface facing the filter substrate 2. In comparison with the configuration of the above-described first preferred embodiment, the height of the filter components 1c and 1d may further be decreased because of the absence of solder bumps H.

If the support substrate 3 includes a ceramic multilayer body, heat dissipation is enhanced. The reason for this is that the thermal conductivity of the ceramic support substrate 3 is generally higher than that of the filter substrate 2 including a piezoelectric substrate. Additionally, in comparison with a process for forming the terminal electrodes 8 requiring a process for forming holes in a resin layer by etching, for example, the land-shaped terminal electrodes 11 may easily be formed on the support substrate 3.

Third Preferred Embodiment

A third preferred embodiment of the present invention will be described below with reference to FIG. 6. In the following description, the configuration different from that of the above-described first and second preferred embodiments will mainly be discussed, and elements similar to those of the first and second preferred embodiments are designated by like reference numerals and an explanation thereof will be omitted.

Figure 6:
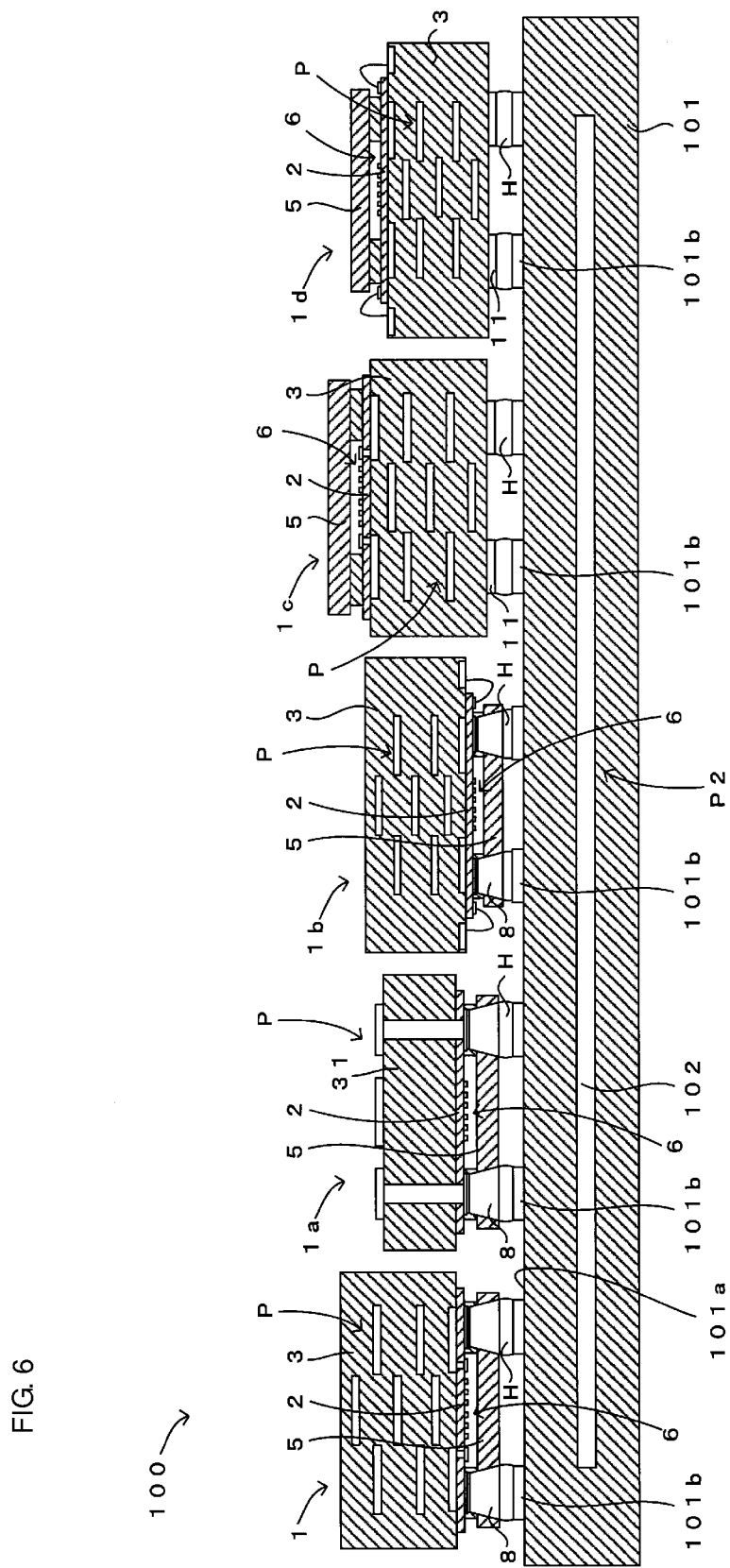
FIG. 6 is a sectional view illustrating a radio-frequency module according to a third preferred embodiment of the present invention.

A radio-frequency module 100 shown in FIG. 6 is mounted on a mother substrate included in a communication mobile terminal such as a cellular phone and a mobile information terminal. In this preferred embodiment, the radio-frequency module 100 is provided as a radio-frequency antenna switch module. The radio-frequency module 100 includes the filter components 1, 1a, 1b, 1c, and 1d respectively shown in FIGS. 1 through 5, a module substrate 101, a matching circuit (not shown), and various electronic components (not shown) such as a switch IC, other filter components, resistors, capacitors, and inductors. It is sufficient that the radio-frequency module 100 includes at least one of the filter components 1, 1a, 1b, 1c, and 1d. However, to show that the radio-frequency module 100 may be provided by including any combination of the filter components 1, 1a, 1b, 1c, and 1d, FIG. 6 illustrates the radio-frequency module 100 including all the filter components 1, 1a, 1b, 1c, and 1d mounted on the module substrate 101.

At least some of the various electronic components, such as the filter components 1, 1a, 1b, 1c, and 1d, a chip passive element component for defining a matching circuit, and others are mounted, via a bonding material such as solder, on mounting electrodes 101b provided on a mounting surface 101a of the module substrate 101. Various components may be mounted on both surfaces of the module substrate.

In this preferred embodiment, the module substrate 101, as well as the support substrate 3, is provided as an integral ceramic multilayer body as a result of firing plural dielectric layers, which are made of ceramic green sheets, stacked on each other. As a result of providing via-conductors and in-planar conductive patterns in the dielectric layers as required, a wiring electrode 102 is disposed in the module substrate 101. In this preferred embodiment, at least a portion of the wiring electrode 102 defines a passive element P2 (another passive element) electrically connected to at least one of the elastic wave filters 6 included in the filter components 1, 1a, 1b, 1c, and 1d.

Circuit elements, such as another inductor and another capacitor, may be defined by the in-planar conductive patterns and via-conductors located in or on the dielectric layers of the module substrate 101. Various circuits, such as another filter circuit and another matching circuit, may be provided by a combination of these circuit elements. The module substrate 101 may include a multilayer substrate such as a printed substrate, a LTCC substrate, an alumina substrate, or a composite material substrate including materials such as resin, ceramic, and polymer materials. The module substrate 101 may be provided by selecting a suitable material according to the purpose of the use of the radio-frequency module 100. If the passive element P2 connected to the elastic wave filter 6 is not preferred, the module substrate 101 may include a single layer substrate made of a suitable material.

As described above, in this preferred embodiment, at least some of passive elements disposed in or on the module substrate 101 in the related art are disposed in or on the filter components 1, 1a, 1b, 1c, and 1d. This allows the module substrate 101 to be made smaller and thinner than the related art, thus reducing the size and the height of the radio-frequency module 100. Additionally, by disposing the passive element P2 in the module substrate 101, the flexibility in disposing passive elements is increased. It is thus possible to enhance the flexibility in designing the radio-frequency module 100.

The difference (absolute value) between the coefficient of linear expansion of the support substrate 3 and that of the module substrate 101 is preferably set to be about 5 ppm/° C. or lower, for example. This makes the value of the coefficient of linear expansion of the support substrate 3 and that of the module substrate 101 be substantially the same, thus improving the reliability of the radio-frequency module 100.

Fourth Preferred Embodiment

A fourth preferred embodiment of the present invention will be described below with reference to FIG. 7. In the following description, the configuration different from that of the second preferred embodiment will mainly be discussed, and elements similar to those of the second preferred embodiment are designated by like reference numerals and an explanation thereof will be omitted.

Figure 7:
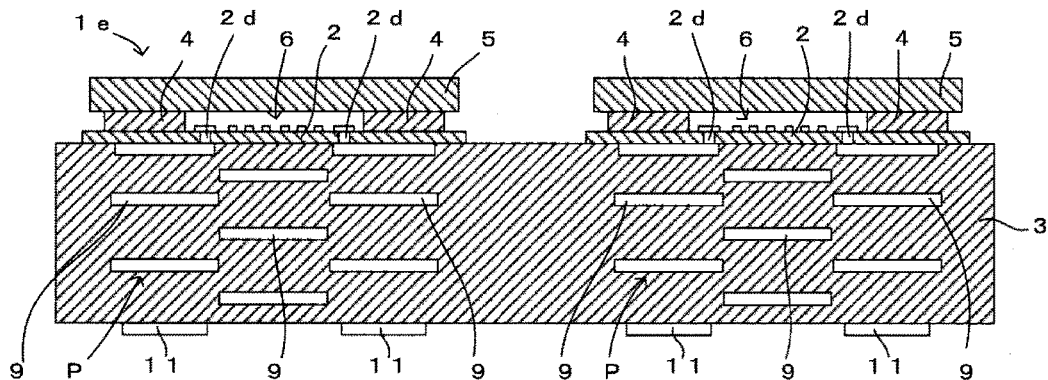
FIG. 7 is a sectional view illustrating a filter component with a passive element according to a fourth preferred embodiment of the present invention.

A filter component 1e with a passive element shown in FIG. 7 is different from the filter component 1c shown in FIG. 4 in that, in adjacent to the filter substrate 2, another filter substrate 2 is provided on the support substrate 3. Three or more filter substrates 2 may be provided on the support substrate 3. Instead of the via-conductors 2d, the elastic wave filters 6 and the support substrate 3 (wiring electrodes 9) may be electrically connected to each other via bonding wire W, as in the examples shown in FIGS. 3 and 5.

Modified examples will be discussed below with reference to FIGS. 8 through 11.

Figure 8:
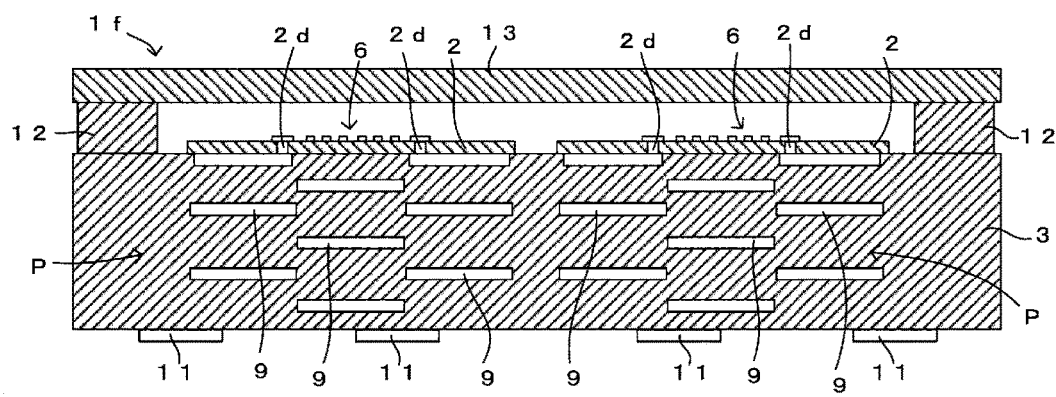
FIG. 8 is a view illustrating a modified example of the filter component shown in FIG. 7.

A filter component 1f with a passive element shown in FIG. 8 is different from the filter component 1e shown in FIG. 7 in the following configuration. An insulating layer 12 is disposed on the support substrate 3 such that the insulating layer 12 surrounds the filter substrates 2 adjacent to each other, and a cover substrate 13 is disposed on the insulating layer 12. By the provision of the cover substrate 13, a space, which is surrounded by the insulating layer 12 and contains the filter substrates 2, is defined between the substrate 13 and the main surface of the support substrate 3 on which the filter substrates 2 are disposed. The substrate 13 is made of a typical substrate material used in such as a printed substrate or a ceramic substrate.

Figure 9:
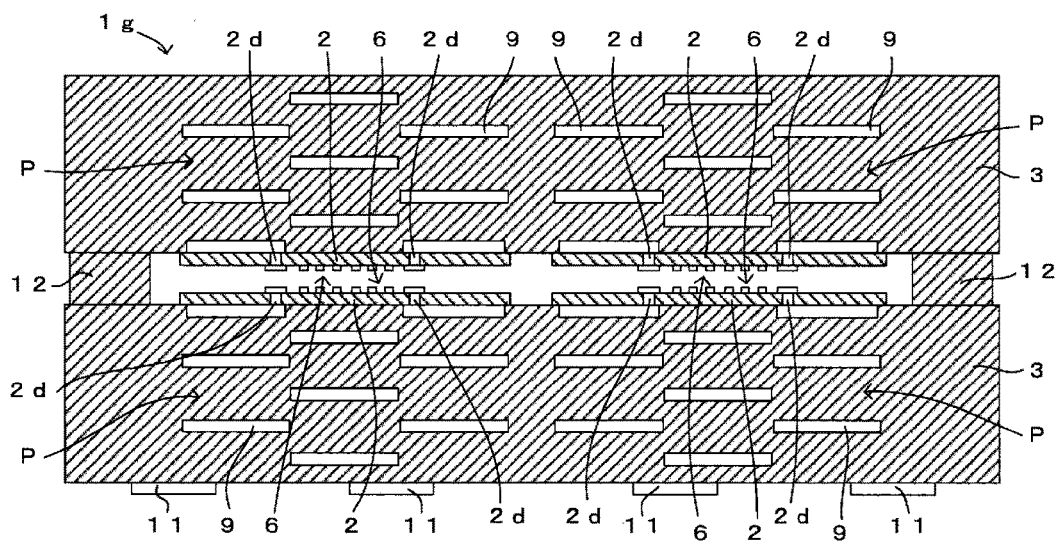
FIG. 9 is a view illustrating another modified example of the filter component shown in FIG. 7.

A filter component 1g with a passive element shown in FIG. 9 is different from the filter component 1f shown in FIG. 8 in the following configuration. Two support substrates 3 are stacked on each other with the insulating layer 12 therebetween in a state in which the main surfaces of the support substrates 3 facing the filter substrates 2 oppose each other, thus defining a space within which the filter substrates 2 are disposed.

Figure 10:
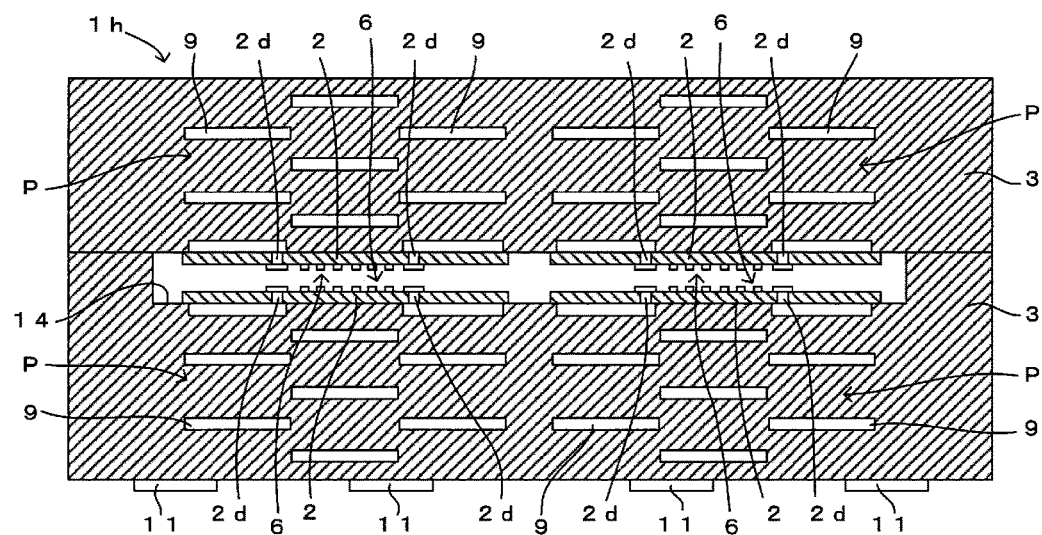
FIG. 10 is a view illustrating another modified example of the filter component shown in FIG. 7.

A filter component 1h with a passive element shown in FIG. 10 is different from the filter component 1g shown in FIG. 9 in the following configuration. Within a recessed portion 14 located on the top surface of one support substrate 3, the filter substrates 2 are disposed, and the other support substrate 3 is disposed to cover the recessed portion 14, thus defining a space within which the filter substrates 2 are disposed.

Figure 11:
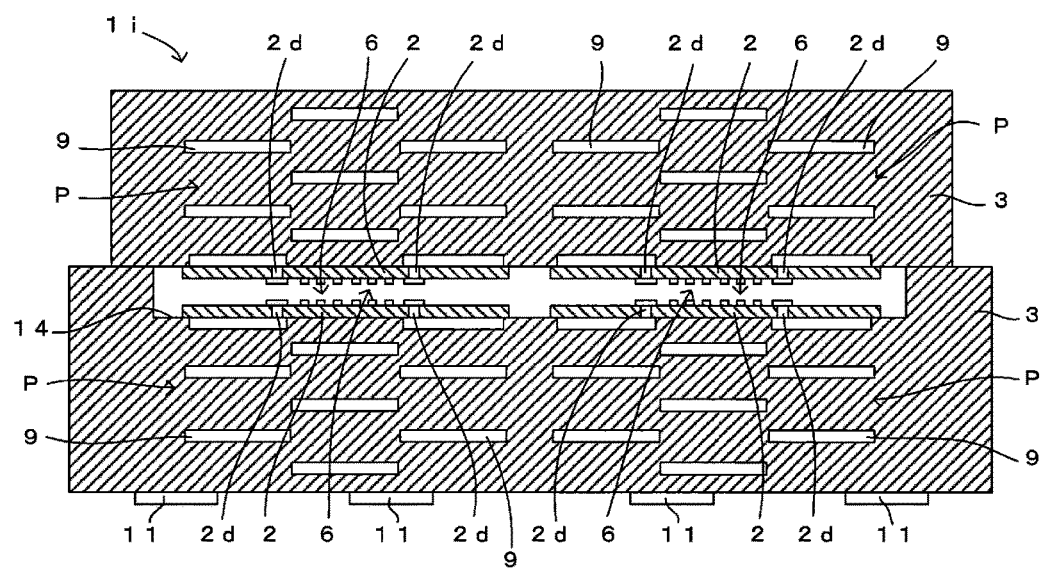
FIG. 11 is a view illustrating another modified example of the filter component shown in FIG. 7.

A filter component 1i with a passive element shown in FIG. 11 is different from the filter component 1h shown in FIG. 10 in that one support substrate 3 is made slightly smaller than the other support substrate 3.

As described above, in this preferred embodiment, it is possible to provide the filter components 1e, 1f, 1g, 1h, and 1i with increased functionalities by providing the plural filter substrates 2 on the support substrate 3.

Fifth Preferred Embodiment

A fifth preferred embodiment of the present invention will be described below with reference to FIG. 12. In the following description, the configuration different from that of the first preferred embodiment will mainly be discussed, and elements similar to those of the first preferred embodiment are designated by like reference numerals and an explanation thereof will be omitted.

Figure 12:
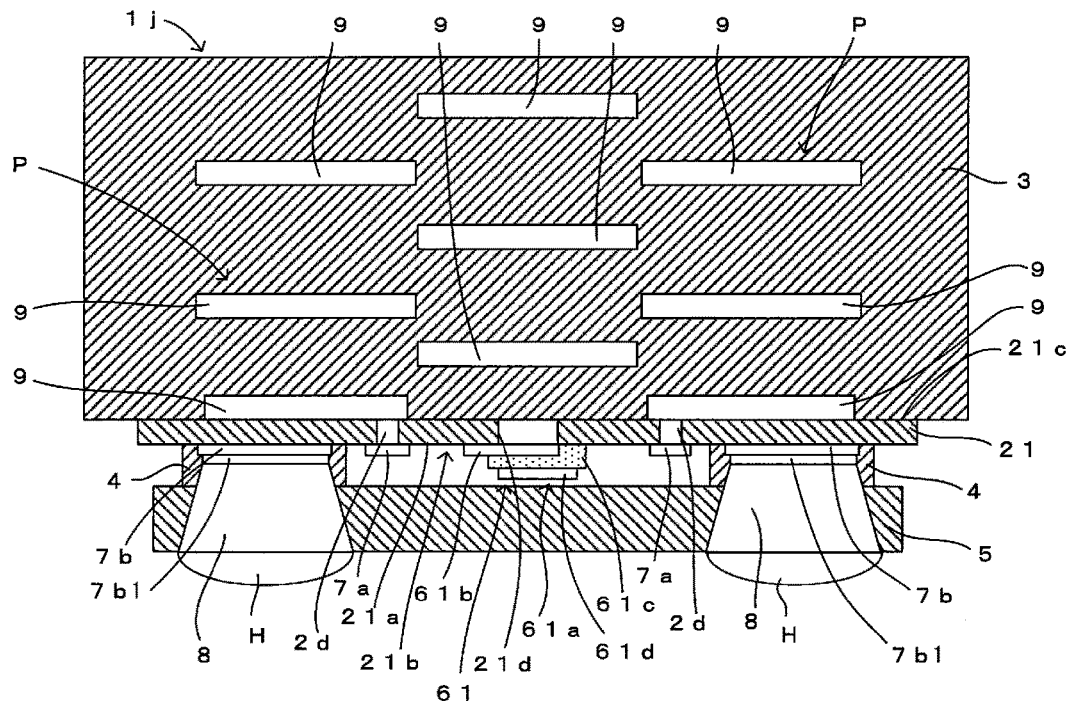
FIG. 12 is a sectional view illustrating a filter component with a passive element according to a fifth preferred embodiment of the present invention.

A filter component 1j with a passive element shown in FIG. 12 is different from the filter component 1 shown in FIG. 1 in the following configuration. In a predetermined region 21b of one main surface 21a of a filter substrate 21 made of Si, an elastic wave filter 61 including a FBAR (Film bulk acoustic resonator) BAW resonator 61a (elastic wave resonator) is provided. The BAW resonator 61a includes a lower electrode 61b, an AlN piezoelectric film 61c, and an upper electrode 61d. The lower electrode 61b is made with a thickness of about 0.5 μm in the predetermined region 21b of the main surface 21a of the filter substrate 21 which is made with a thickness of about 80 μm, for example. The AlN piezoelectric film 61c is made with a thickness of about 1.7 μm and is stacked on the lower electrode 61b. The upper electrode 61d is stacked on the AlN piezoelectric film 61c. An opening 21d is located in a portion of the filter substrate 21 on which the BAW resonator 61a is disposed.

As in the above-described first preferred embodiment, a support substrate 3 is disposed on the other main surface 21c of the filter substrate 21. The elastic wave filter 61 and a passive element P in the support substrate 3 are electrically connected to each other by using, as an example, via-conductors 2d provided in the filter substrate 21. Instead of the via-conductors 2d, bonding wire W may be used to electrically connect the elastic wave filter 61 and the support substrate 3 (wiring electrodes 9), as in the examples shown in FIGS. 3 and 5. As in the above-described second preferred embodiment, external-connecting terminal electrodes 11 may be disposed on the main surface of the support substrate 3 on the side opposite to the other main surface facing the filter substrate 21.

A modified example will be discussed below with reference to FIG. 13.

Figure 13:
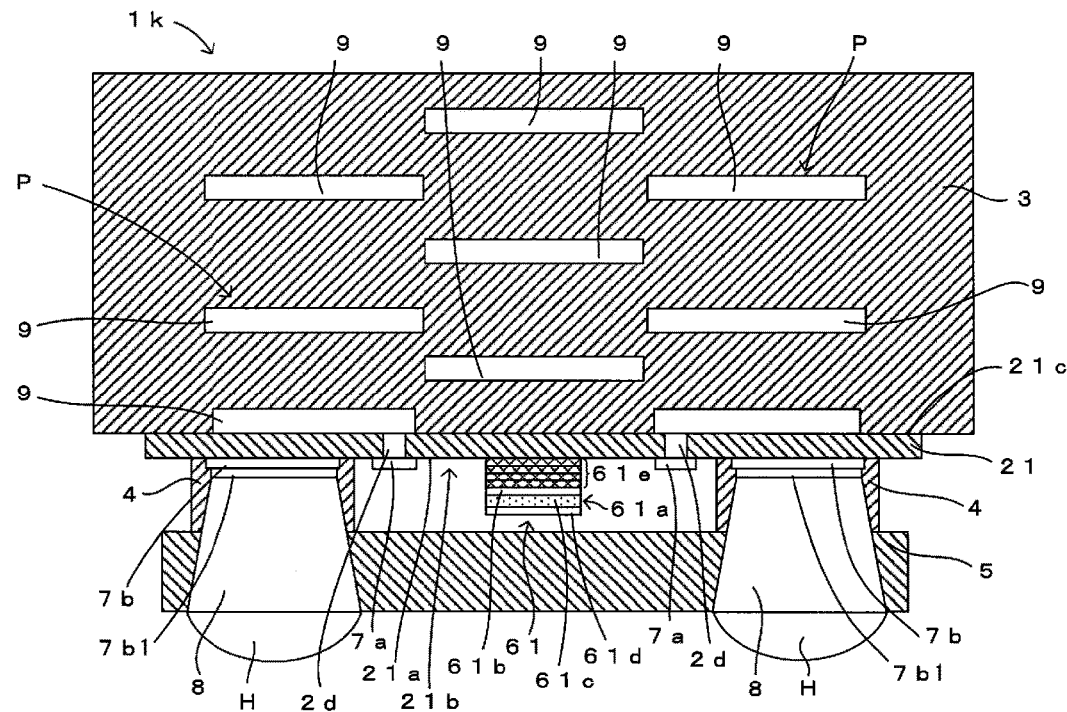
FIG. 13 is a view illustrating a modified example of the filter component shown in FIG. 12.

A filter component 1k with a passive element shown in FIG. 13 is different from the filter component 1j shown in FIG. 12 in that the elastic wave resonator 61 includes a SMR (solid mounted resonator) BAW resonator 61a. The BAW resonator 61a includes a reflection layer 61e, which is a multilayer body of a high impedance layer and a low impedance layer, disposed in the predetermined region 21b of one main surface 21a of the filter substrate 21. A lower electrode 61b, an AlN piezoelectric film 61c, and an upper electrode 61d are stacked on the reflection layer 61e.

As described above, in this preferred embodiment, the elastic wave filter 61 includes the BAW resonator 61a, which is an elastic wave resonator. By disposing the support substrate 3 including the passive element P disposed therein on the other main surface 21c of the filter substrate 21, the filter substrate 21 may be made thinner than the related art. Hence, advantages similar to those of the first preferred embodiment are achieved.

Sixth Preferred Embodiment

A sixth preferred embodiment of the present invention will be described below with reference to FIG. 14. In the following description, the configuration different from that of the first preferred embodiment will mainly be discussed, and elements similar to those of the first preferred embodiment are designated by like reference numerals and an explanation thereof will be omitted.

Figure 14:
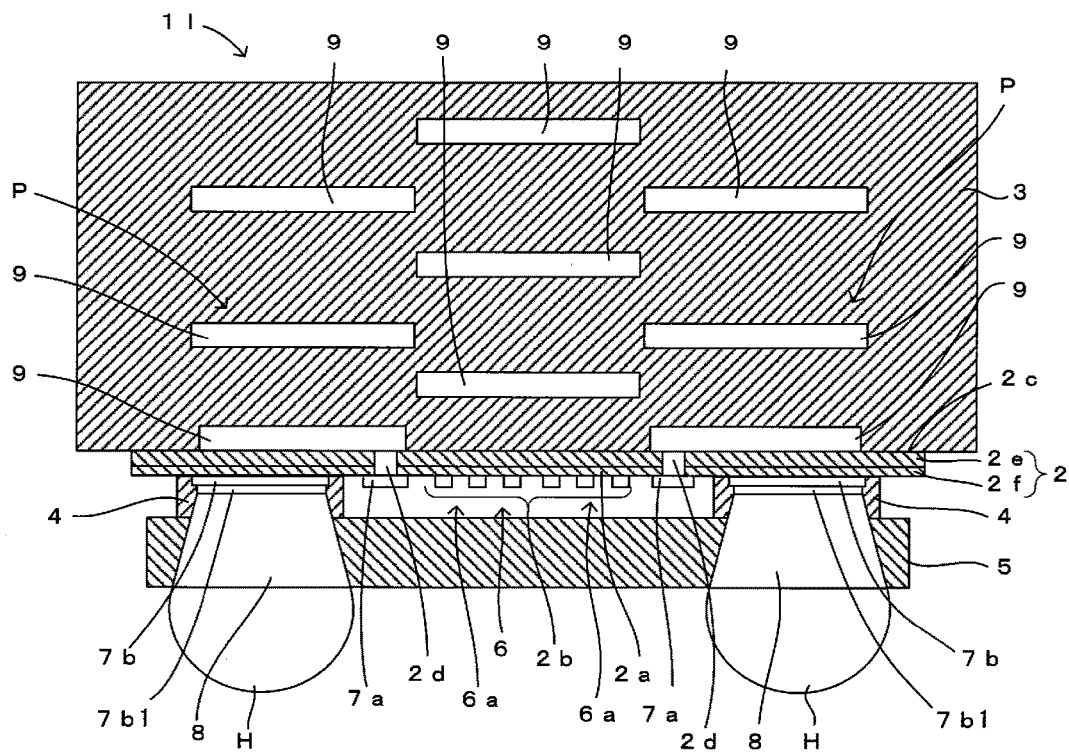
FIG. 14 is a sectional view illustrating a filter component with a passive element according to a sixth preferred embodiment of the present invention.

A filter component 11 with a passive element shown in FIG. 14 is different from the filter component 1 shown in FIG. 1 in that the filter substrate 2 includes a double-layer structure including a high acoustic velocity layer 2e and a piezoelectric layer 2f. The high acoustic velocity layer 2e is made of AlN preferably with a thickness of about three times as large as the pitch p of comb-shaped electrodes, while the piezoelectric layer 2f is made of LiTaO$_3$ preferably with a thickness of about 0.5 times as large as the pitch p of comb-shaped electrodes, for example. With this structure, surface acoustic waves do not leak to the support substrate 3 because the acoustic velocity of bulk waves in AlN is higher than that of surface acoustic waves propagating on LiTaO$_3$. The filter substrate 2 may thus be made thinner without decreasing the characteristics of surface acoustic waves. The thickness of the piezoelectric layer 2f is desirably at least about 0.05 times as large as the pitch p of the comb-shaped electrodes, for example. If the piezoelectric layer 2f is thinner than this thickness, the piezoelectricity is decreased, which makes it difficult to obtain sufficient filter characteristics.

In this preferred embodiment, the high acoustic velocity layer 2e is a layer which makes the acoustic velocity of bulk waves propagating in the high acoustic velocity layer 2e faster than elastic waves such as surface acoustic waves and boundary waves propagating on the piezoelectric layer 2f. Multiple modes of elastic waves including different acoustic velocities are excited from an IDT electrode including a certain structure. Elastic waves propagating on the piezoelectric layer 2f are those of a specific mode utilized to obtain the characteristics of a filter and a resonator. The mode of bulk waves, which determines the acoustic velocity of bulk waves, is defined in accordance with the mode of elastic waves propagating in the piezoelectric layer 2f. If the high acoustic velocity layer 2e exhibits the isotropic properties with respect to the propagating direction of bulk waves, the mode of bulk waves is defined as in Table 1. That is, a mode of bulk waves propagating in the high acoustic velocity layer is defined by the primary mode of elastic waves. The primary modes of elastic wave are shown on the left side in Table 1, and the modes of bulk wave each of which corresponds to the primary mode of elastic wave are shown on the right side of Table 1. P waves are longitudinal waves, while S waves are transversal waves. In Table 1, U1 is elastic waves including P waves as the primary component, U2 is elastic waves including SH waves as the primary component, and U3 is elastic waves including SV waves as the primary component.

TABLE 1

Association between elastic wave modes of piezoelectric layer (film) and bulk wave modes of high acoustic velocity layer (dielectric film) (when the high acoustic velocity layer is made of a material including isotropic properties)

| Primary mode of elastic waves propagating on piezoelectric layer | Mode of bulk waves propagating in high acoustic velocity layer (dielectric film) |
|---|---|
| U1 | P waves |
| U2 | S waves |
| U3 + U1 | S waves |

The primary modes of elastic wave are shown on the left side in Table 2, and the modes of bulk wave each of which corresponds to the primary mode of elastic wave are shown on the right side of Table 2 in the case in which the high acoustic velocity layer 2e exhibits the anisotropic properties with respect to the propagation properties of bulk waves. Among the modes of bulk waves, one of SH waves and SV waves that are slower than the other are called slow transversal waves, and one of SH waves and SV waves that are faster than the other are called fast transversal waves. Which one of SH waves and SV waves are slow transversal waves is determined by the anisotropic properties of the material. For rotated-Y-cut LiTaO$_3$ or LiNbO$_3$, SV waves are slow transversal waves and SH waves are fast transversal waves.

TABLE 2

Association between elastic wave modes of piezoelectric layer (film) and bulk wave modes of high acoustic velocity layer (dielectric film) (when the high acoustic velocity layer is made of a material including anisotropic properties)

| Primary mode of elastic waves propagating on piezoelectric layer | Mode of bulk waves propagating in high acoustic velocity layer (dielectric film) |
|---|---|
| U1 | P waves |
| U2 | SH waves |
| U3 + U1 | SV waves |

Instead of AlN, the high acoustic velocity layer 2e may be made of another medium, such as SiN, Al$_2$O$_3$, Si, or sapphire, which makes the acoustic velocity of bulk waves faster than that of surface acoustic waves propagating on a piezoelectric substrate. The high acoustic velocity layer 2e may be provided in a multilayer structure as a combination of materials, such as AlN and SiO$_2$. In this case, the weighted average of the acoustic velocities of bulk waves in the individual layers is the acoustic velocity of bulk waves in the high acoustic velocity layer.

In this preferred embodiment, when the pitch of the comb-shaped electrodes of the elastic wave resonator 6a, which is set in accordance with the resonant and anti-resonant frequencies, is p μm, the piezoelectric layer 2f is made with a thickness t expressed by:

0.05·p μm≤t≤100 μm, for example.

As described above, in this preferred embodiment, by providing the filter substrate 2 with a structure of two or more layers by using materials including different acoustic velocities, the filter substrate 2 may be made even thinner. It is thus possible to further decrease the height of the filter component 11.

The present invention is not restricted to the above-described preferred embodiments. Various modifications other than those described above may be made without departing from the spirit and the scope of the present invention. Additionally, the configurations of the above-described preferred embodiments may be combined in any manner.

Preferred embodiments of the present invention are widely applicable to a filter component with a passive element, which includes an elastic wave filter including an elastic wave resonator, and also to a radio-frequency module including the filter component.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter component with a passive element, comprising:
a filter substrate;
an elastic wave filter including an elastic wave resonator in a predetermined region of one main surface of the filter substrate; and
a support substrate disposed on another main surface of the filter substrate; wherein
a passive element is provided in or on the support substrate; and
the passive element includes a wiring electrode and is electrically connected to the elastic wave filter; wherein
the filter substrate is a double layer substrate including a high acoustic velocity layer and a piezoelectric layer;
the piezoelectric layer is disposed on one main surface of the high acoustic velocity layer, and the support substrate is disposed on another main surface of the high acoustic velocity layer;
the elastic wave filter is a SAW filter which includes the elastic wave resonator including comb-shaped electrodes disposed on one main surface of the piezoelectric layer; and
an acoustic velocity of bulk waves propagating in the high acoustic velocity layer is faster than an acoustic velocity of elastic waves propagating on the piezoelectric layer.

2. The filter component according to claim 1, wherein a thickness of the filter substrate is less than a thickness of the support substrate.

3. The filter component according to claim 1, wherein a thickness of the filter substrate is less than about 100 μm.

4. The filter component according to claim 1, wherein, when a pitch of the comb-shaped electrodes is p μm, a thickness t of the piezoelectric layer is expressed by:

$0.05 \cdot p \ \mu m \leq t \leq 100 \ \mu m.$

5. The filter component according to claim 1, wherein the support substrate is a multilayer substrate.

6. The filter component according to claim 5, wherein the passive element is integrated within the multilayer substrate.

7. The filter component according to claim 1, further comprising:
an insulating layer surrounding the predetermined region of the one main surface of the filter substrate;
a cover layer disposed on the insulating layer so as to define, together with the insulating layer, a surrounded space between the filter substrate and the cover layer; and
an external-connecting terminal electrode that is exposed on a main surface of the cover layer on a side opposite to another main surface of the cover layer facing the space and that is electrically connected to the elastic wave filter.

8. The filter component according to claim 1, further comprising:
an insulating layer surrounding the predetermined region of the one main surface of the filter substrate;
a cover layer disposed on the insulating layer so as to define, together with the insulating layer, a surrounded space between the filter substrate and the cover layer; and
an external-connecting terminal electrode that is provided on a main surface of the support substrate on a side opposite to another main surface of the support substrate facing the filter substrate and that is electrically connected to the elastic wave filter.

9. The filter component according to claim 1, wherein, in adjacent to the filter substrate, another filter substrate is provided on the support substrate.

10. A radio-frequency module comprising:
the filter component according to claim 1; and
a module substrate on which the filter component is mounted.

11. The radio-frequency module according to claim 10, wherein another passive element connected to the elastic wave filter is provided in or on the module substrate.

12. The filter component according to claim 1, wherein the passive element includes an inductor or a capacitor and adjusts filter characteristics of the elastic wave filter.

13. The filter component according to claim 1, wherein
the support substrate is a multilayer substrate including a plurality of dielectric layers; and
the passive element includes an inductor or a capacitor that is defined by conductive patterns disposed within the multilayer substrate.

14. The filter component according to claim 1, further comprising:
a via-conductor located in the filter substrate; wherein
the via conductor electrically connects the wiring electrode of the passive element to the elastic wave filter.

15. The filter component according to claim 1, further comprising:
a bonding wire electrically connecting the wiring electrode of the passive element to the elastic wave filter.

16. The filter component according to claim 1, wherein
the wiring electrode of the passive element is disposed on a main surface of the support substrate on a side opposite to another main surface of the support substrate that faces the filter substrate.

17. The filter component according to claim 16, further comprising an interlayer-connecting conductor disposed such that the interlayer-connecting conductor passes through the filter substrate and the support substrate so as to connect a terminal electrode located on the one main surface of the filter substrate with the wiring electrode of the passive element.

* * * * *